(12) United States Patent
Minixhofer et al.

(10) Patent No.: US 9,842,946 B2
(45) Date of Patent: Dec. 12, 2017

(54) SEMICONDUCTOR DEVICE COMPRISING AN EMITTER OF RADIATION AND A PHOTOSENSOR AND APPERTAINING PRODUCTION METHOD

(71) Applicant: ams AG, Unterpremstaetten (AT)

(72) Inventors: Rainer Minixhofer, Unterpremstaetten (AT); Bernhard Stering, Stainz (AT); Harald Etschmaier, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/317,641

(22) PCT Filed: May 22, 2015

(86) PCT No.: PCT/EP2015/061413
§ 371 (c)(1),
(2) Date: Dec. 9, 2016

(87) PCT Pub. No.: WO2015/189022
PCT Pub. Date: Dec. 17, 2015

(65) Prior Publication Data
US 2017/0125613 A1    May 4, 2017

(30) Foreign Application Priority Data

Jun. 11, 2014 (EP) .................................. 14171940

(51) Int. Cl.
*H01L 31/02* (2006.01)
*H01L 31/0216* (2014.01)
(Continued)

(52) U.S. Cl.
CPC .... *H01L 31/02164* (2013.01); *H01L 31/0203* (2013.01); *H01L 31/02005* (2013.01);
(Continued)

(58) Field of Classification Search
CPC ............. H01L 31/02164; H01L 31/153; H01L 31/0203; H01L 31/1876; H01L 31/02325; H01L 31/02005; H01L 31/02019
See application file for complete search history.

(56) References Cited

U.S. PATENT DOCUMENTS 8,507,936 B2   8/2013  Lee
2005/0212069 A1   9/2005  Sato et al.
(Continued)

FOREIGN PATENT DOCUMENTS

JP   2004-063772 A   2/2004
JP   2007-123856 A   5/2007
WO   2013/091829 A1  6/2013

*Primary Examiner* — Roy Potter
*Assistant Examiner* — Paul Patton
(74) *Attorney, Agent, or Firm* — McDermott Will & Emery LLP

(57) ABSTRACT

The semiconductor device comprises a semiconductor substrate (1), a photosensor (2) integrated in the substrate (1) at a main surface (10), an emitter (12) of radiation mounted above the main surface (10), and a cover (6), which is at least partially transmissive for the radiation, arranged above the main surface (10). The cover (6) comprises a cavity (7), and the emitter (12) is arranged in the cavity (7). A radiation barrier (9) can be provided on a lateral surface of the cavity (7) to inhibit cross-talk between the emitter (12) and the photosensor (2).

11 Claims, 6 Drawing Sheets

(51) Int. Cl.
*H01L 31/153* (2006.01)
*H01L 31/0203* (2014.01)
*H01L 31/0232* (2014.01)
*H01L 31/18* (2006.01)

(52) U.S. Cl.
CPC .. *H01L 31/02019* (2013.01); *H01L 31/02325* (2013.01); *H01L 31/153* (2013.01); *H01L 31/1876* (2013.01)

(56) References Cited

U.S. PATENT DOCUMENTS

| | | | |
|---|---|---|---|
| 2011/0207257 A1* | 8/2011 | Watanabe | H01L 27/14618 438/66 |
| 2012/0133956 A1* | 5/2012 | Findlay | H01L 31/173 356/614 |
| 2013/0153933 A1* | 6/2013 | Lee | H01L 31/1876 257/82 |
| 2014/0042615 A1 | 2/2014 | Huang et al. | |

* cited by examiner

SEMICONDUCTOR DEVICE COMPRISING AN EMITTER OF RADIATION AND A PHOTOSENSOR AND APPERTAINING PRODUCTION METHOD

BACKGROUND OF THE INVENTION

Optical emitter-detector modules comprise an emitter of radiation like a light-emitting diode and a photosensor like a photodiode, and may be supplied with passive optical elements like apertures or lenses and with an integrated circuit. An opaque element can be applied to reduce optical cross-talk between the emitter and the photosensor.

WO 2013/091829 A1 discloses an opto-electronic module with at least one emission member and at least one detection member mounted on a substrate, which may be a printed circuit board, an optics member comprising at least one passive optical component, and a spacer member arranged between the substrate and the optics member. A portion of the spacer member may be arranged between the emission member and the detection member and thus separate the module into compartments. The emission member and the detection member can each be provided with a lense. The module can be produced by preparing a wafer stack comprising a multitude of the components of the module and separating the wafer stack into a multitude of separate modules each comprising a portion of a substrate wafer, at least one emission member, at least one detection member and a portion of a spacer wafer.

U.S. Pat. No. 8,507,936 B2 discloses an image sensing device comprising a substrate, a photo sensor and an IC stacking layer. An intermediate layer, a micro lens and a micro prism are arranged on top of the IC stacking layer.

SUMMARY OF THE INVENTION

In conjunction with the disclosed invention, the terms "photosensor" and "optical component" shall specify components that are used to detect or affect electromagnetic radiation without implying a restriction of the range of wavelengths of the relevant radiation. The photosensor may be provided for a detection of radiation in any specified range of wavelengths, which is not restricted to visible light, in particular. The term "passive optical component" shall mean a component that is provided to affect the propagation of the radiation, especially to direct, focus or filter the radiation, without necessitating an electrical current or an application of a voltage.

The semiconductor device comprises a semiconductor substrate, a photosensor integrated in the substrate at a main surface, an emitter of radiation mounted above the main surface, and a cover, which is at least partially transmissive for the radiation. The cover is arranged above the main surface and comprises a cavity, which accommodates the emitter.

An embodiment of the semiconductor device further comprises an integrated circuit in the substrate.

A further embodiment comprises a radiation barrier on a surface of the cavity, especially on a lateral surface of the cavity. The radiation barrier shields the radiation and thus prevents or at least reduces cross-talk between the emitter and the photosensor.

In a further embodiment the cover comprises a semiconductor layer arranged on a glass wafer, the cavity penetrating the semiconductor layer.

A further embodiment comprises a further cavity of the cover, the further cavity being arranged above the photosensor.

In a further embodiment at least one passive optical component is formed in or on the cover above the emitter and/or above the photosensor.

A further embodiment comprises a dielectric layer arranged on or above the main surface, the cover being arranged on the dielectric layer, a wiring arranged in the dielectric layer, a via hole penetrating the substrate outside the photosensor, and a metallization layer arranged in the via hole, the metallization layer forming an electrical interconnection to the wiring.

In a further embodiment a portion of the wiring is provided as a shield inhibiting the propagation of the radiation.

In a further embodiment the emitter and the wiring comprise contact pads, and one of the contact pads of the wiring is connected with one of the contact pads of the emitter by a contact connection comprising an alloy of copper and tin.

The method of producing a semiconductor device comprises integrating a photosensor at a main surface of a semiconductor substrate, providing the main surface with a dielectric layer and with a wiring embedded in the dielectric layer, the wiring comprising a contact pad, mounting an emitter of radiation above the main surface, a contact pad of the emitter being electrically connected with the contact pad of the wiring, and mounting a cover provided with a cavity above the main surface, so that the emitter is arranged in the cavity.

In a variant of the method, a radiation barrier, which shields the radiation, is arranged on a surface of the cavity.

In a further variant of the method, a via hole penetrating the substrate outside the photosensor is formed after mounting the cover, and a metallization layer is arranged in the via hole, thus forming an electrical interconnection to the wiring.

In a further variant of the method, a via hole is formed penetrating the substrate outside the photosensor, and before mounting the emitter, a metallization layer is arranged in the via hole, thus forming an electrical interconnection to the wiring.

In a further variant of the method, the emitter and the wiring are provided with contact pads, and one of the contact pads of the wiring is connected with one of the contact pads of the emitter by a contact connection produced by forming an alloy of copper and tin.

In a further variant of the method, the cover is formed by applying a semiconductor layer on a glass wafer, and the cavity is formed by etching an opening into the semiconductor layer, until the glass wafer is uncovered in the opening.

The following is a detailed description of examples of the semiconductor device and the production method in conjunction with the appended figures.

DETAILED DESCRIPTION

Figure 1:
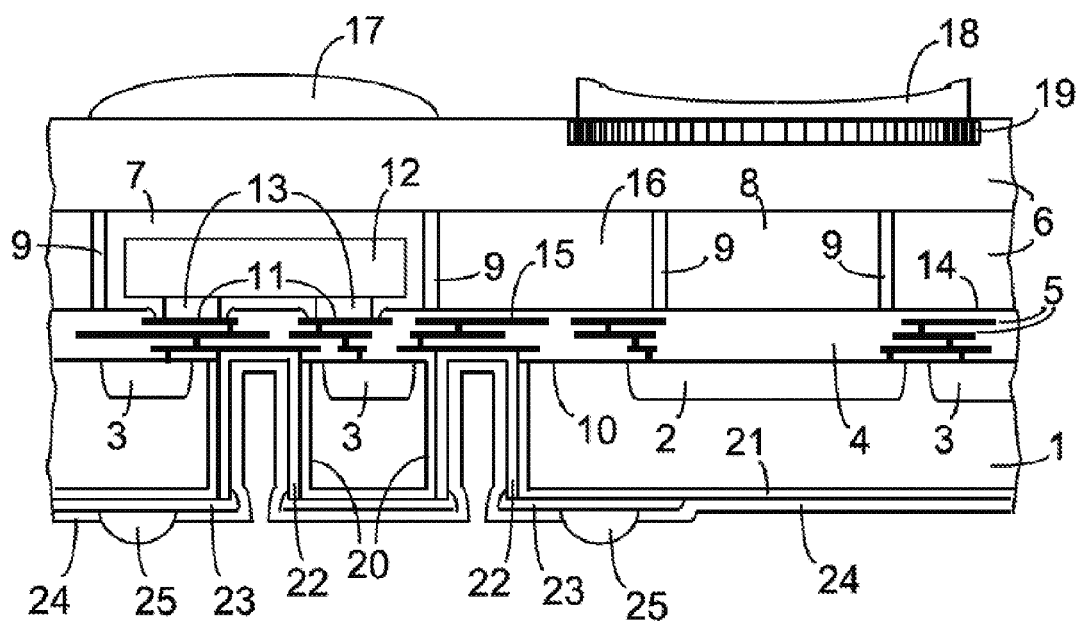
FIG. 1 is a cross section of an embodiment of the semiconductor device.

FIG. 1 is a cross section of an embodiment of the semiconductor device comprising a semiconductor substrate 1, which may be a silicon wafer, for instance, an integrated photosensor 2 at a main surface 10 of the substrate 1, an integrated circuit 3 at the main surface 10, a dielectric layer 4 on the main surface 10, and a wiring 5 embedded in the dielectric layer 4, which may be silicon dioxide, for instance, and serves as an intermetal dielectric for the wiring 5. The photosensor 2 may be any detector of radiation like a photodiode, for instance. The integrated circuit 3 may be a CMOS circuit, for instance. An emitter 12 for radiation is mounted above the dielectric layer 4. The emitter 12 may be a light-emitting diode (LED), for instance, in particular an infrared LED. The wiring 5 is provided for electric connections of the integrated circuit 3 and the emitter 12. Contact connections 13 can be provided as electric connections between contact pads of the emitter 12 and contact pads 11 of the wiring 5.

The substrate 1 can comprise a through-substrate via formed by a via hole 20 in the substrate 1 and a metallization layer 22 arranged in the via hole 20. The metallization layer 22 may be insulated from the semiconductor material by a dielectric material, which may be part of a further dielectric layer 21, for example. A structured top metal layer 23 is arranged on the rear surface of the device and electrically connected with the metallization layer 22. The metallization layer 22 and the top metal layer 23 can be individual layers, as shown in FIG. 1 by way of example, or they can be formed by one entire metal layer. The metallization layer 22 is in contact with one of the metal layers of the wiring 5 above the main surface 10, so that a through-substrate via is formed as an interconnection between a conductor on or above the main surface 10 and a further conductor on or above the rear surface of the semiconductor substrate 1. There may be any number and arrangement of through-substrate vias, which can especially be provided for external electric connections of the integrated photosensor 2, the integrated circuit 3 and/or the emitter 12. The top metal layer 23 may be covered with a passivation layer 24, which can be silicon nitride, for instance. Openings in the passivation layer 24 may be provided for the arrangement of bump contacts 25, which can in particular be formed by solder balls.

A cover 6, which comprises a cavity 7 accommodating the emitter 12, is mounted on or above the dielectric layer 4 and covers the emitter 12 and the photosensor 2. The cover 6 comprises a material that is transparent for the radiation emitted by the emitter 12 and for the radiation that is to be detected by the photosensor 2. The cover 6 may be a glass wafer comprising silicon dioxide, for instance. The cover 6 may further comprise a semiconductor layer 16. Lateral surfaces of the cavity 7 may be provided with a radiation barrier 9, which shields the radiation and thus inhibits cross-talk between the emitter 12 and the photosensor 2.

The height of the emitter 12 may typically be in the range from 90 µm to 150 µm, and the height of the cavity 7 may typically be in the range from 100 µm to 200 µm. The height of the cover 6 may typically be in the range from 500 µm to 800 µm. A further cavity 8 may be provided in the cover 6 above the photosensor 2 to facilitate the propagation of incident radiation directed to the photosensor 2. The height of the cavity 7 and the height of the further cavity 8 may be equal, especially if the cavities 7, 8 are formed in the same step of production, in particular by selectively etching openings into the semiconductor layer 16.

The interface 14 between the dielectric layer 4 or an optional passivation layer, which may form the surface of the dielectric layer 4, and the cover 6 is indicated in FIG. 1. A bonding layer or an adhesive layer may be provided at the interface 14 to fasten the cover 6 to the substrate 1.

The wiring 5 may be formed by structured metal layers and vertical interconnections. The structured metal layers may also serve to form shields 15 preventing the propagation of radiation in undesired directions, in order to reduce cross-talk between the emitter 12 and the photosensor 2.

At least one passive optical component like a lens or zone plate may be formed in or on the cover 6 above the photosensor 2, and at least one further passive optical component may be formed in or on the cover 6 above the emitter 12. FIG. 1 shows a convex lens 17 arranged on an area of the surface of the cover 6 opposite the emitter 12 and a concave lens 18 arranged on a further area of the surface of the cover 6 opposite the photosensor 2. The emitter 12 and the photosensor 2 can instead both be provided with the same type of lens or with other passive optical components. A diffracting element can alternatively or additionally be arranged in or on the cover 6, in particular a zone plate 19 as shown in FIG. 1. Such a zone plate 19 comprises a set of radially symmetric Fresnel zones, which are spaced to generate constructive interference at the desired focus. Zone plates and their application to semiconductor devices are known per se. The Fresnel zones can be formed by concentric circular trenches of suitably varying diameters, widths and distances, which may especially be filled with a suitable refractive material to produce a phase shift zone plate, wherein half wavelength phase delays are created between adjacent ring zones. Sloping sidewalls of the trenches may be adapted to form a Fresnel lens, which is also known per se from conventional optical devices and need not be described in detail.

Figure 2:
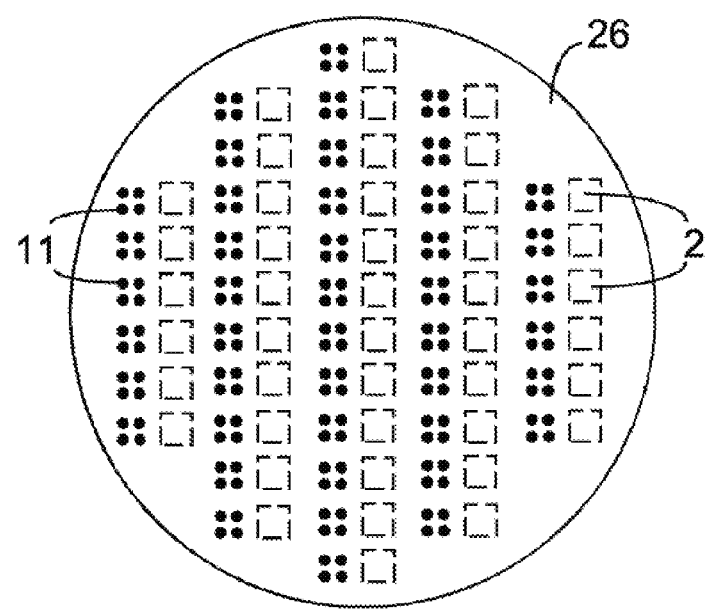
FIG. 2 is a top view of an arrangement of components of a plurality of semiconductor devices on a wafer.

FIG. 2 is a top view of an arrangement of a plurality of the components of the semiconductor device on a wafer 26. FIG. 2 shows how a plurality of semiconductor devices can be manufactured on a common wafer 26, especially on a silicon wafer 26, by integrating a plurality of the photosensors 2 in the wafer 26 and mounting a plurality of the emitters 12 on the wafer 26. The positions of the photosensors 2 are indicated in FIG. 2 by squares, which are represented with broken lines as hidden contours, because the photosensors 2 are covered by the dielectric layer 4. The positions where the emitters 12 are to be mounted are indicated by the positions of the contact pads 11. In the example shown in FIG. 2 there are four contact pads 11 for each emitter 12, which are arranged at the corners of a square. After the emitters 12 have been mounted, a cover 6 comprising a plurality of cavities 7 is mounted, so that each of the cavities 7 accommodates one of the emitters 12. Then the wafer 26 and the cover 6 are together separated into the individual semiconductor devices.

Figure 3:
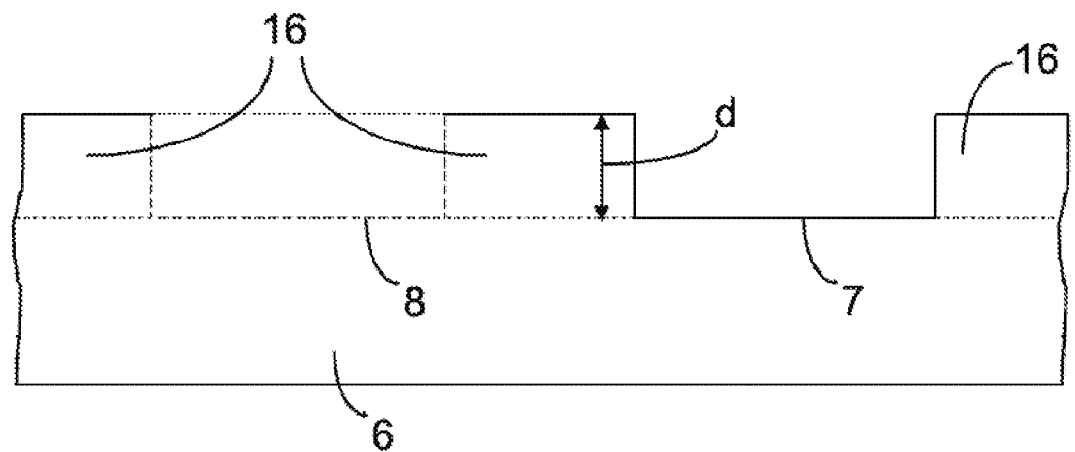
FIG. 3 is a cross section of an intermediate product of a production method.

FIG. 3 is a cross section of an intermediate product of the cover, which is used in the production method. The cover 6 can be formed from a glass wafer comprising silicon dioxide. The glass wafer can be provided with a semiconductor layer 16, which may be silicon and which is indicated in FIG. 3 with dotted lines. If the semiconductor layer 16 is not provided, the glass wafer also encompasses the volume of the semiconductor layer 16 shown in FIG. 3. For each device that is to be produced on the wafer 26, according to FIG. 2, a cavity 7, which is intended to accommodate one of the emitters 12, is produced in the cover 6. The cavity 7 can be produced by etching a recess in the surface of the cover 6, for example. The depth d of the recess, which equals the height of the cavity 7, may typically be in the range from 100 µm to 200 µm. If the semiconductor layer 16 is provided, the etching can be performed selectively with respect to silicon dioxide and stops when the silicon dioxide, which serves as an etch stop layer, is reached. A further cavity 8, which is indicated in FIG. 3 with broken lines, can optionally be provided to be arranged above the photosensor 2. The further cavity 8 is produced in a region lateral to the region of the cavity 7, optionally as a further recess of the same depth d and by the same etching step. The further method steps will be described for embodiments comprising the further cavity 8. If the further cavity 8 is not provided, the corresponding surface area of the cover 6 is planar.

Figure 4:
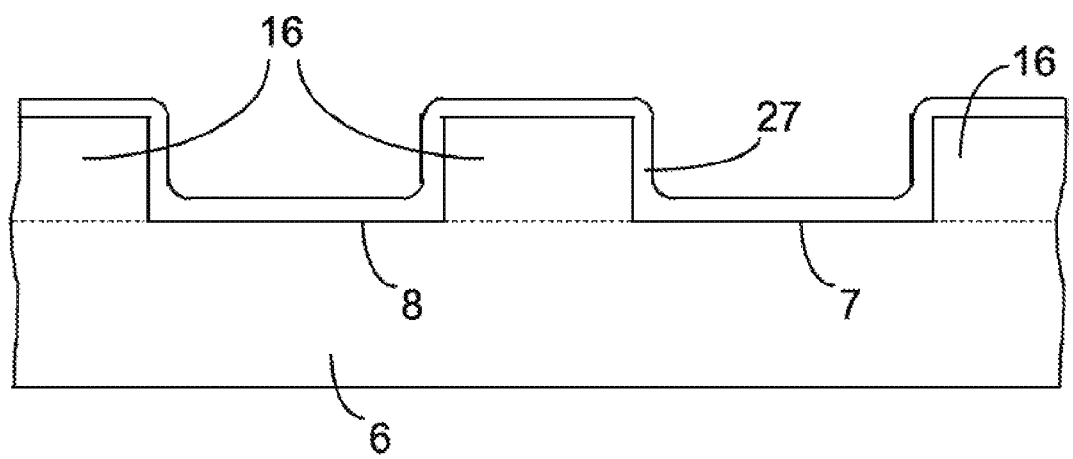
FIG. 4 is a cross section according to FIG. 3 after the application of a barrier layer.

FIG. 4 is a cross section according to FIG. 3 after the application of an optional barrier layer 27, which is provided for the formation of the radiation barrier 9. The barrier layer 27 may be a metal layer, especially a tungsten layer, optionally having a thickness of less than 500 nm, for instance, and may be deposited by chemical vapor deposition (CVD) or high-pressure physical vapor deposition (PVD) to cover the entire surface of the cover 6, including the sidewalls and bottoms of the cavities 7, 8. The barrier layer 27 is anisotropically etched to remove it from the upper surface and from the bottoms of the cavities 7, 8.

Figure 5:
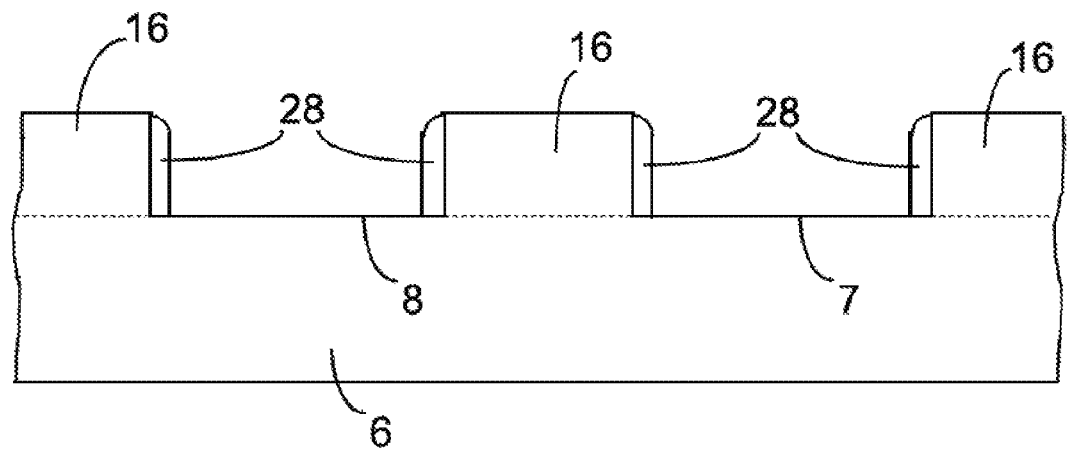
FIG. 5 is a cross section according to FIG. 4 after the partial removal of the barrier layer.

FIG. 5 is a cross section according to FIG. 4 after the partial removal of the barrier layer 27. Residual portions of the barrier layer 27 form spacers 28 at the sidewalls of the cavities 7, 8. These spacers 28 are intended to function as the radiation barriers 9 shown in FIG. 1.

Figure 6:
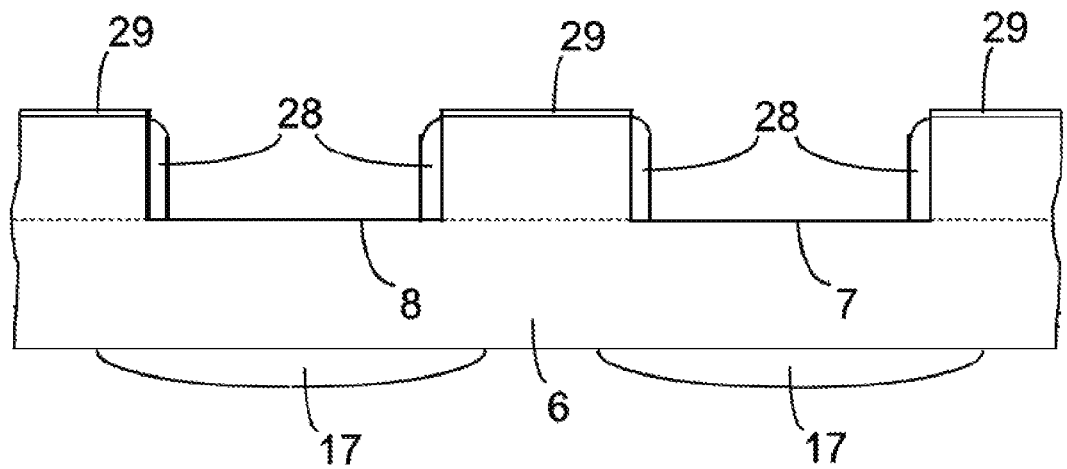
FIG. 6 is a cross section according to FIG. 5 after the formation of passive optical components.

Passive optical components like the convex lenses 17 shown in FIG. 6 may be formed at this stage of the production process. The convex lenses 17 and similar surface structures or reliefs can be produced by nanolithography, for instance. The passive optical components can instead be produced after the cover 6 has been mounted to the wafer 26. Furthermore, the surface area between the passive optical components can be treated to reduce the reflection of radiation. For this purpose, an antireflective coating, a layer of black paint or a layer of graded refractive index can be arranged in this surface area of the cover 6. A thin adhesive layer 29 may be applied to the opposite surface of the cover 6 between the cavities 7, 8. The adhesive layer 29 is provided to fasten the cover 6 to the wafer 26, especially to the dielectric layer 4 or to a passivation layer forming the surface of the dielectric layer 4. The adhesive layer 29 may comprise a glue, which can be applied by screen printing, for example.

Figure 7:
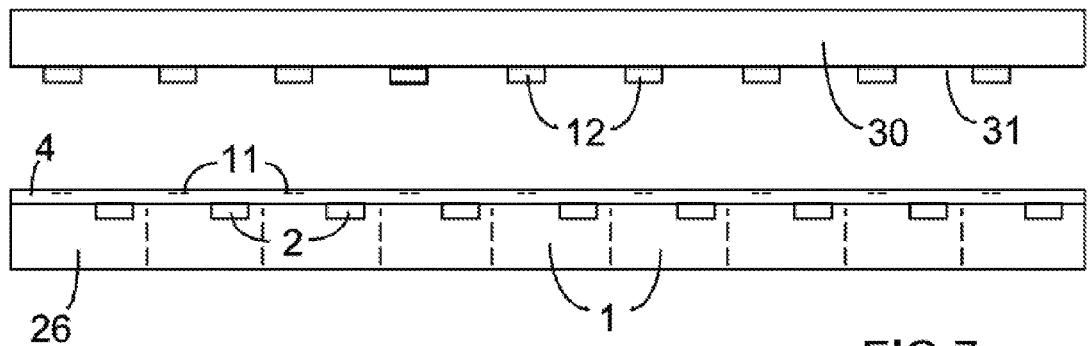
FIG. 7 is a cross section of an arrangement for applying emitter devices to a substrate wafer.

FIG. 7 is a cross section of an arrangement for the application of the emitters 12 to the wafer 26 comprising the integrated photosensors 2. The emitters 12 are temporarily fastened to a handling wafer 30 by means of a further adhesive layer 31 according to the positions of the contact pads 11 of the wirings 5. The handling wafer 30 is arranged opposite the surface of the wafer 26 with the emitters 12 facing the wafer 26. The wafers 26, 30 are approached, and the contact pads of the emitters 12 are electrically connected to the contact pads 11 of the wirings 5. Thereby the emitters 12 are mounted to the wafer 26. The mounted emitters 12 are distributed over the wafer 26 according to the distribution of the integrated photosensors 2 and are thus each disposed on one of the substrates 1 of the individual semiconductor devices, which are indicated in FIG. 7 by the vertical broken lines. After the emitters 12 have been mounted, the handling wafer 30 is removed.

Figure 8:
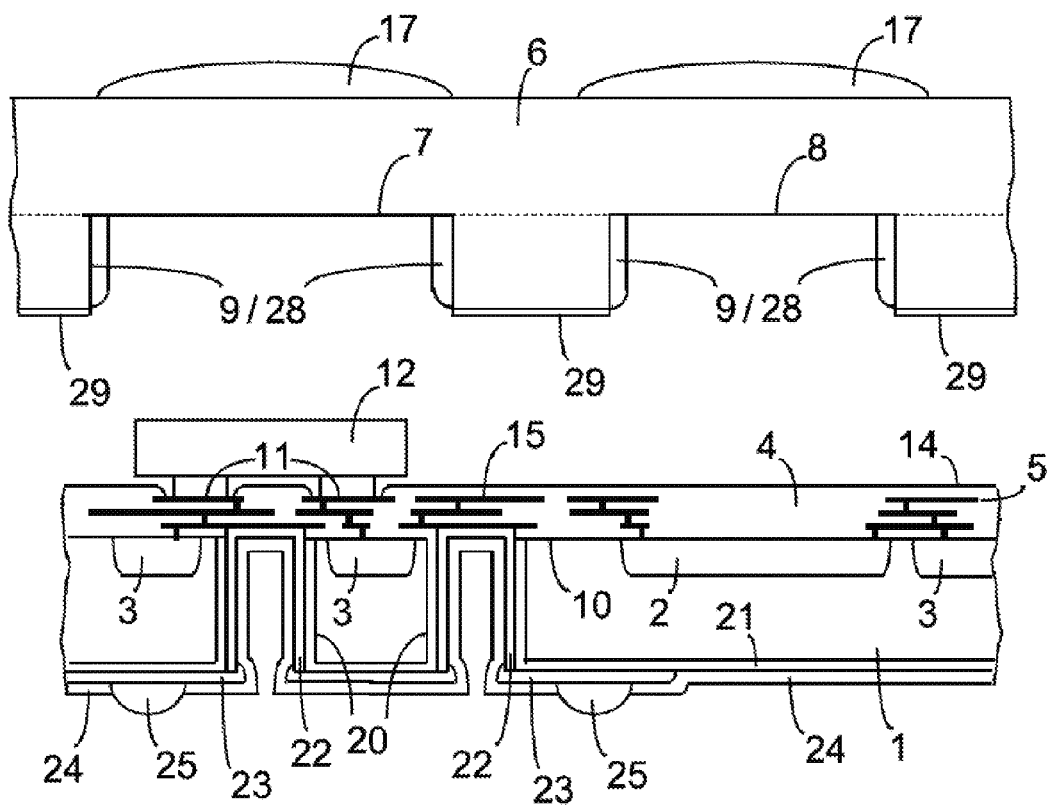
FIG. 8 is a cross section of an arrangement of the substrate and the cover just before mounting.

FIG. 8 is a cross section of an arrangement of one of the substrates 1, which in this stage of the production may still form part of the wafer 26, and the cover 6 immediately before the cover 6 is mounted to the wafer 26. The cavity 7 is arranged above the emitter 12, and the further cavity 8 is arranged above the photosensor 2. The cover 6 and the substrate 1 are approached until the adhesive layer 29 contacts the interface 14. The emitter 12 is arranged in the cavity 7 and surrounded by the radiation barrier 9 formed by the spacer 28. In this way an embodiment of the semiconductor device is produced, which differs from the embodiment according to FIG. 1 only by the passive optical components.

The wafer 26 may already be provided with through-substrate vias before the emitters 12 and the cover 6 are mounted. Mounting the emitters 12 on a wafer 26 comprising through-substrate vias is suitable for emitter devices that do not tolerate the temperatures occurring during the production of the through-substrate vias, in particular for organic LEDs.

Figure 9:
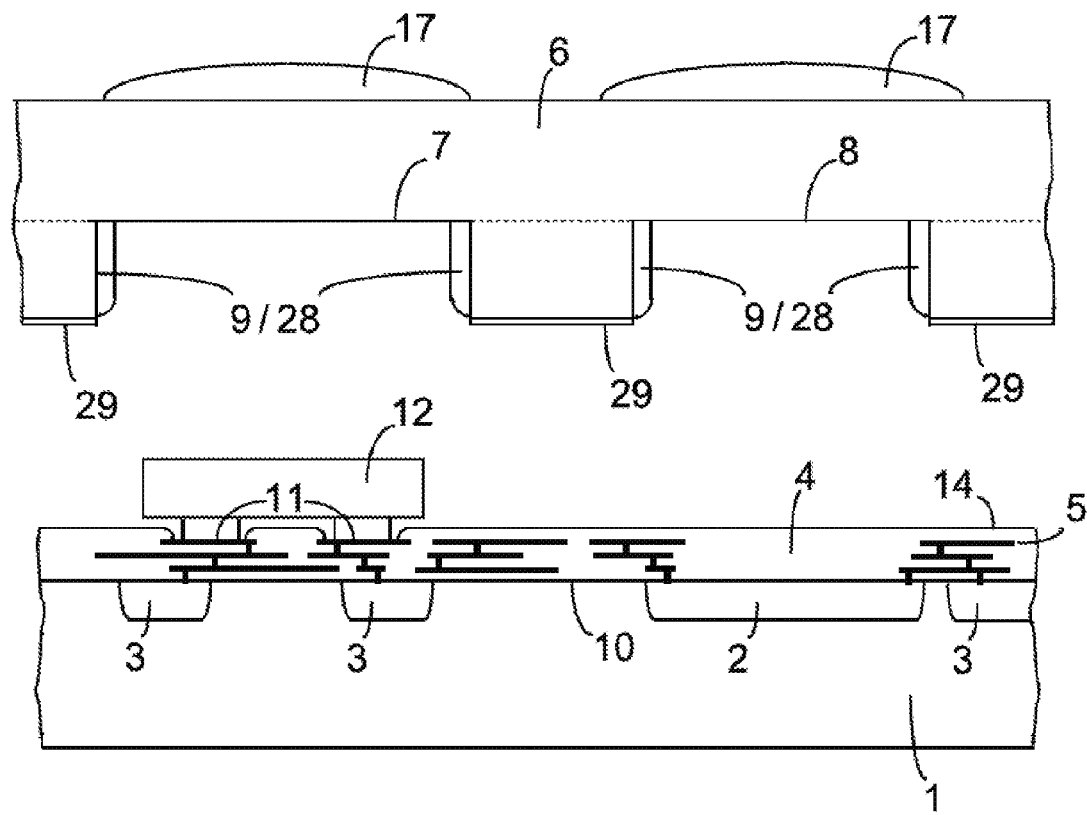
FIG. 9 is a cross section according to FIG. 8 for a further embodiment.

FIG. 9 is a cross section according to FIG. 8 for a variant of the method, which can be applied if the emitters 12 tolerate process temperatures of typically 400° C., which occur during the production of the through-substrate vias. Elements shown in FIG. 9 that correspond to similar elements shown in FIG. 8 are designated with the same reference numerals. In the method according to FIG. 9, the emitter 12 and the cover 6 are mounted before via holes 20 are etched into the substrate 1 and before the metallization layers 22 are applied.

Figure 10:
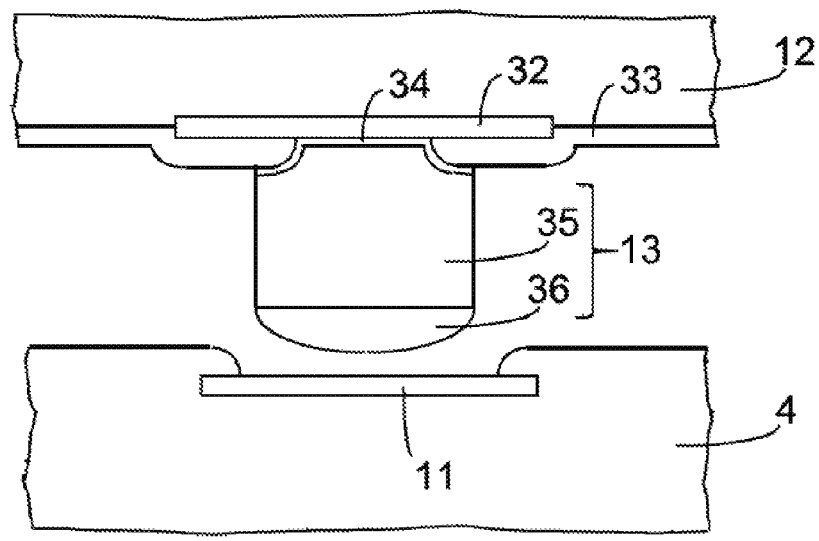
FIG. 10 is a cross section of an arrangement for producing a contact connection.

FIG. 10 is a cross section of a contact connection 13 between a contact pad 32 of the emitter 12 and a contact pad 11 located on the dielectric layer 4. Such a contact connection 13 can be produced in a copper soldering process, which is known per se and enables shallow electrical connections. The copper soldering process, wherein tin is deposited on copper and subsequently reflown, yields a copper/tin alloy $Cu_3Sn$ ("epsilon phase"), which has a melting point of 676° C., well above the process temperatures occurring during the production of the through-substrate vias. The contact pad 32 of the emitter 12 may be aluminum, for instance. The contact pad 11 of the wiring 5 may comprise a copper surface, for instance. The surface of the emitter 12 facing the dielectric layer 4 may be covered with a passivation layer 33, which leaves a contact area of the contact pad 32 free. The contact area can be provided with an underbump metallization 34, which may be titanium, for instance. The contact connection 13 may comprise a contact pillar 35 and a contact cap 36. The contact pillar 35 comprises copper, especially Cu/CuNi. The contact cap 36 comprises tin, especially Sn/SnAg. Instead of forming the contact pillar 35 and the contact cap 36 on the contact pads 32 of the emitter 12, it is also possible to produce the contact connection 13 by depositing copper on the contact pads 11 of the wiring 5 and tin on the copper, and then performing a reflow of the tin to form the alloy.

Figure 11:
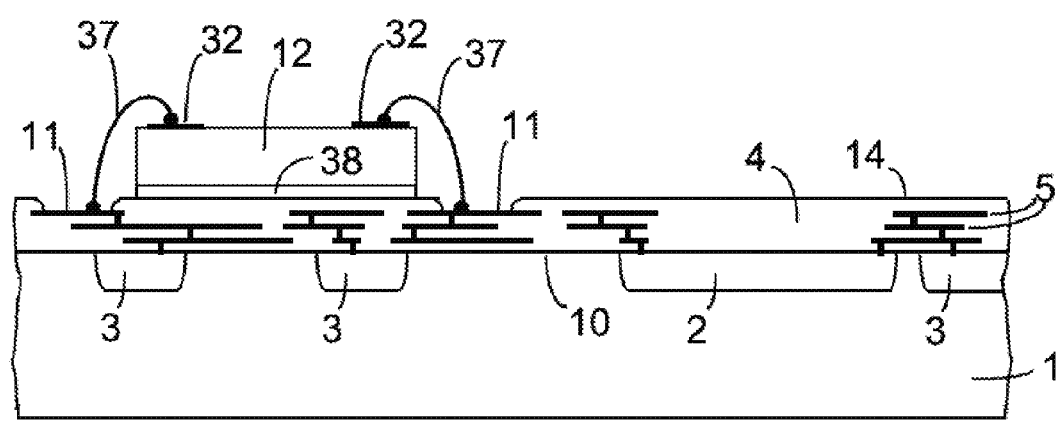
FIG. 11 is a cross section of the substrate and the mounted emitter for a further embodiment.

FIG. 11 is a cross section of the substrate 1 for a further embodiment, which comprises bond wires 37 as electric connections between the contact pads 11 of the wiring 5 and the contact pads 32 of the mounted emitter 12. In this embodiment, the emitter 12 is mounted by means of a further adhesive layer 38, which is applied between the side of the emitter 12 opposite the contact pads 32 and a surface of the dielectric layer 4. In particular, this arrangement is appropriate for an emitter 12 that emits radiation on the side carrying the contact pads 32, whereas the previously described arrangements using flip-chip connections or the like are appropriate for an emitter 12 that emits radiation from a rear side, opposite the contact pads 32.

The described arrangement of an emitter, a photosensor and a cover for enhanced inhibition of cross-talk provides a compact electro-optical module, which can be produced by a manufacturing method compatible with standard CMOS processes.

The invention claimed is:

1. A semiconductor device, comprising:
    a substrate with a main surface;
    a photosensor at the main surface;
    an emitter of radiation mounted above the main surface;
    a cover, which is at least partially transmissive for the radiation, arranged above the main surface;
    the substrate being a semiconductor substrate;
    the photosensor being integrated in the substrate;
    the cover comprising a cavity, the emitter being arranged in the cavity,
    wherein the cover comprises a semiconductor layer arranged on a glass wafer, the cavity penetrating the semiconductor layer.

2. The semiconductor device of claim 1, further comprising:
    an integrated circuit in the substrate.

3. The semiconductor device of claim 1, further comprising:
    a radiation barrier, which shields the radiation, on a surface of the cavity.

4. The semiconductor device of claim 1, further comprising:
    a further cavity of the cover, the further cavity being arranged above the photosensor.

5. The semiconductor device of claim 1, further comprising:
    at least one passive optical component formed in or on the cover above the emitter and/or above the photosensor.

6. A semiconductor device comprising:
    a substrate with a main surface;
    a photosensor at the main surface;
    an emitter of radiation mounted above the main surface;
    a cover, which is at least partially transmissive for the radiation, arranged above the main surface;
    the substrate being a semiconductor substrate;
    the photosensor being integrated in the substrate;
    the cover comprising a cavity, the emitter being arranged in the cavity;
    a dielectric layer arranged on or above the main surface, the cover being arranged on the dielectric layer;
    a wiring arranged in the dielectric layer;
    a via hole penetrating the substrate outside the photosensor; and
    a metallization layer arranged in the via hole, the metallization layer forming an electrical interconnection to the wiring,
    wherein the emitter and the wiring comprise contact pads, and
    wherein one of the contact pads of the wiring is connected with one of the contact pads of the emitter by a contact connection comprising an alloy of copper and tin.

7. The semiconductor device of claim 6, wherein a portion of the wiring is provided as a shield inhibiting the propagation of the radiation.

8. A method of producing a semiconductor device, comprising:
    integrating a photosensor at a main surface of a semiconductor substrate;
    providing the main surface with a dielectric layer and with a wiring embedded in the dielectric layer, the wiring comprising a contact pad;
    mounting an emitter of radiation above the main surface, a contact pad of the emitter being electrically connected with the contact pad of the wiring;
    mounting a cover provided with a cavity above the main surface, so that the emitter is arranged in the cavity;
    providing the emitter and the wiring with contact pads; and
    connecting one of the contact pads of the wiring with one of the contact pads of the emitter by a contact connection produced by forming an alloy of copper and tin.

9. The method of claim 8, further comprising:
    forming a radiation barrier on a surface of the cavity, before the cover is mounted.

10. A method of producing a semiconductor device, comprising:
    integrating a photosensor at a main surface of a semiconductor substrate;
    providing the main surface with a dielectric layer and with a wiring embedded in the dielectric layer, the wiring comprising a contact pad;
    mounting an emitter of radiation above the main surface, a contact pad of the emitter being electrically connected with the contact pad of the wiring;
    mounting a cover provided with a cavity above the main surface, so that the emitter is arranged in the cavity;
    forming the cover by applying a semiconductor layer on a glass wafer; and
    forming the cavity by etching an opening into the semiconductor layer, until the glass wafer is uncovered in the opening.

11. A method of producing a semiconductor device, comprising:
    integrating a photosensor at a main surface of a semiconductor substrate;
    providing the main surface with a dielectric layer and with a wiring embedded in the dielectric layer, the wiring comprising a contact pad;
    forming a via hole penetrating the substrate outside the photosensor;
    arranging a metallization layer in the via hole, thus forming an electrical interconnection to the wiring;
    mounting, after the metallization is arranged in the via hole, an emitter of radiation above the main surface, a contact pad of the emitter being electrically connected with the contact pad of the wiring; and
    mounting a cover provided with a cavity above the main surface, so that the emitter is arranged in the cavity.

* * * * *